United States Patent [19]
Yuri et al.

[11] Patent Number: 6,030,886
[45] Date of Patent: Feb. 29, 2000

[54] GROWTH OF GAN ON A SUBSTRATE USING A ZNO BUFFER LAYER

[75] Inventors: Masaaki Yuri, Nagaokakyo, Japan; Tetsuzo Ueda, Menlo Park; Takaaki Baba, Los Altos, both of Calif.

[73] Assignee: Matsushita Electronics Corporation, Osaka, Japan

[21] Appl. No.: 08/979,695

[22] Filed: Nov. 26, 1997

[30] Foreign Application Priority Data

Nov. 29, 1996 [JP] Japan ................................... 8-319102

[51] Int. Cl.⁷ ..................................................... H01L 21/20
[52] U.S. Cl. ........................... 438/493; 438/478; 438/479; 438/482; 438/483; 117/952
[58] Field of Search .................................. 438/22, 45, 46, 438/47, 478, 479, 481, 482, 488, 503, 507, 967, 493; 257/13, 76, 103; 117/952

[56] References Cited

U.S. PATENT DOCUMENTS 4,473,938  10/1984  Kobayashi et al. .
5,278,435   1/1994  Van Hove et al. .

FOREIGN PATENT DOCUMENTS 0607435   7/1994   European Pat. Off. .
0647730  10/1994   European Pat. Off. .
57-10280   1/1982  Japan .
4-068579   3/1992  Japan .
4-68579    3/1992  Japan .
07267787  10/1995  Japan .

*Primary Examiner*—Charles Bowers
*Assistant Examiner*—Keith Christianson
*Attorney, Agent, or Firm*—McDermott, Will & Emery

[57] ABSTRACT

To present a manufacturing method of semiconductor device capable of forming a homogeneous and highly reproducible gallium nitride crystal, comprising the steps of forming a zinc oxide layer on a monocrystalline substrate, forming a first gallium nitride crystal in a temperature range from 0° C. to 900° C., and forming a second gallium nitride crystal in a temperature range from 900° C. to 2000° C.

5 Claims, 6 Drawing Sheets

GROWTH OF GAN ON A SUBSTRATE USING A ZNO BUFFER LAYER

FIELD OF THE INVENTION

The present invention relates to a semiconductor device and its manufacturing method, and more particularly to a monocrystalline gallium nitride crystal and its manufacturing method.

BACKGROUND OF THE INVENTION

Gallium nitride crystal is expected as a material for short wavelength laser light emission of about 400 nm in wavelength or a material for high temperature and high speed transistor, but homogeneous monocrystalline gallium nitride crystal has not been obtained yet at the present.

A conventional method for manufacturing semiconductor device is described by referring to FIG. 6(a), FIG. 6(b), and FIG. 6(c). As shown in FIG. 6(a) and FIG. 6(b), a zinc oxide layer 2 of film thickness of 500 Angstroms is formed on a monocrystalline substrate 1 made of sapphire at temperature of 500° C. in an oxygen atmosphere by using a sputtering apparatus. Next, the monocrystalline substrate 1 forming the zinc oxide layer 2 is dismounted from the sputtering apparatus, the temperature of the monocrystalline substrate 1 is raised to 1000° C. by using a halide VPE apparatus, and ammonia and gallium chloride produced by reaction between metal gallium and hydrochloric acid gas are supplied into the halide VPE apparatus, thereby forming a gallium nitride crystal 3 in a film thickness of about 100 μm as shown in FIG. 6(c).

In this way, the crystal growth of gallium nitride crystal is generally conducted by heteroepitaxial growth using sapphire as monocrystalline substrate 1.

Incidentally, the lattice constant of the zinc oxide layer 2 is 3.250 Angstroms in the a-axis direction of hexagonal system, which is close to the lattice constant 3.189 Angstroms of gallium nitride, and it is hence used to alleviate lattice mismatching between sapphire and gallium nitride.

However, when forming gallium nitride crystal by the conventional method for manufacturing semiconductor device, since the monocrystalline substrate is heated to high temperature of about 1000° C. which is an appropriate temperature for growth of gallium nitride, oxygen may be vaporized from the zinc oxide layer so that the zinc oxide layer decompose, or the zinc oxide layer may be etched by ammonium chloride formed by reaction of raw material gas. As a result, the zinc oxide layer may be non-uniform, and it was therefore hard to form homogeneous gallium nitride crystal over the entire area on the zinc oxide layer at high reproducibility.

SUMMARY OF THE INVENTION

It is hence an object of the invention to present, a semiconductor device made of homogenous gallium nitride crystal, and a manufacturing method capable of forming such semiconductor device at high reproducibility.

The invention is characterized by forming a zinc oxide layer on a monocrystalline substrate, and forming a first gallium nitride layer in a temperature range from 0 to 900° C., then forming a second gallium nitride layer in a temperature range of 900 to 2000° C. Therefore, according to the invention, in the forming process of the second gallium nitride layer, since the zinc oxide layer is protected by the first gallium nitride layer, it is effective to prevent decomposition of zinc oxide layer due to vaporization of oxygen from the zinc oxide layer or etching by reaction gas.

BRIEF DESCRIPTION OF THE DRAWINGS

FIG. 5(a), FIG. 5(b), FIG. 5(c), FIG. 5(d), and FIG. 5 (e) are sectional views showing the manufacturing process or a semiconductor device in a third embodiment of the invention.

DESCRIPTION OF THE PREFERRED EMBODIMENTS

A manufacturing method of semiconductor device of the invention is described below.

(Embodiment 1)

As shown in FIG. 1(a) and FIG. 1(b), by sputtering a zinc oxide target in an oxygen atmosphere of 0.01 Torr by using a sputtering apparatus, a zinc oxide layer 2 is formed in a film thickness of about 500 Angstroms on a monocrystalline substrate 1 made of sapphire, then, as shown in FIG. 1(c), by sputtering a gallium nitride target while holding the substrate temperature at 500° C. in a nitrogen atmosphere of 0.01 Torr, a first gallium nitride crystal 4 is formed in a film thickness of about 500 Angstroms.

Since the first gallium nitride crystal 4 is formed at low temperature of 500° C., the zinc oxide layer 2 is not decomposed by vaporization of oxygen from the zinc oxide layer 2, or the zinc oxide layer 2 is not etched by ammonium chloride formed by reaction of raw material gas, but, on the other hand, since the first gallium nitride crystal 4 is formed at low temperature of 500° C., it becomes polycrystalline.

Consequently, in an ammonia atmosphere, the first gallium nitride crystal 4 is heated from room temperature to 1000° C. from time T1 to time T2. By this heating process, the polycrystallino first gallium nitride crystal 4 is made slightly monocrystalline. Since this heating process is done in an ammonia atmosphere, vaporization of nitrogen from the first gallium nitride crystal 4 can be prevented.

Moreover, keeping the substrate temperature at 1000° C., from time T2 to time T3, by feeding ammonia and gallium chloride formed by reaction between metal gallium and hydrochloric acid gas into a halide VPE apparatus, a second gallium nitride crystal 5 is formed in a film thickness of about 100 μm as shown in FIG. 1(d). This second gallium nitride crystal 5 is formed on the first gallium nitride crystal 4 matched in lattice, and the forming temperature is as high as 1000° C., so that a uniform single crystal is formed on the entire surface.

In the embodiment, since the first gallium nitride crystal is formed on the zinc oxide layer 2 without exposing the zinc oxide layer 2 to the atmosphere, surface contamination of the zinc oxide layer 2 can be prevented.

(Embodiment 2)

A manufacturing method of semiconductor device according to a second embodiment of the invention is described below.

Figure 3:
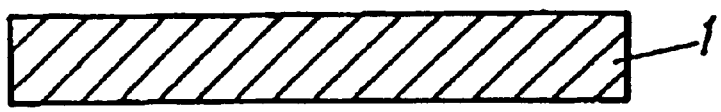
FIG. 3(a), FIG. 3(b), FIG. 3(c), and FIG. 3(d) are sectional views showing the manufacturing process of a semiconductor device in a second embodiment of the invention.
Figure 3:
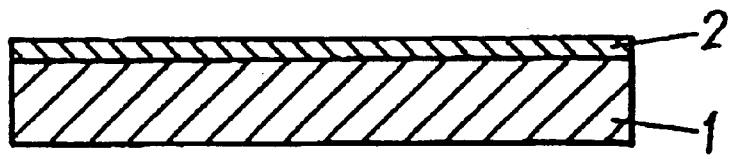
Figure 3:
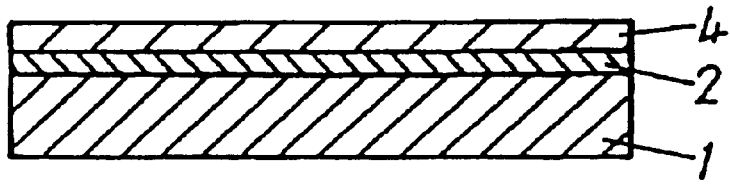
Figure 3:
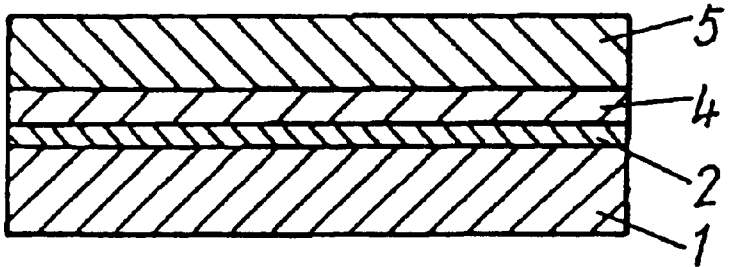
Figure 4:
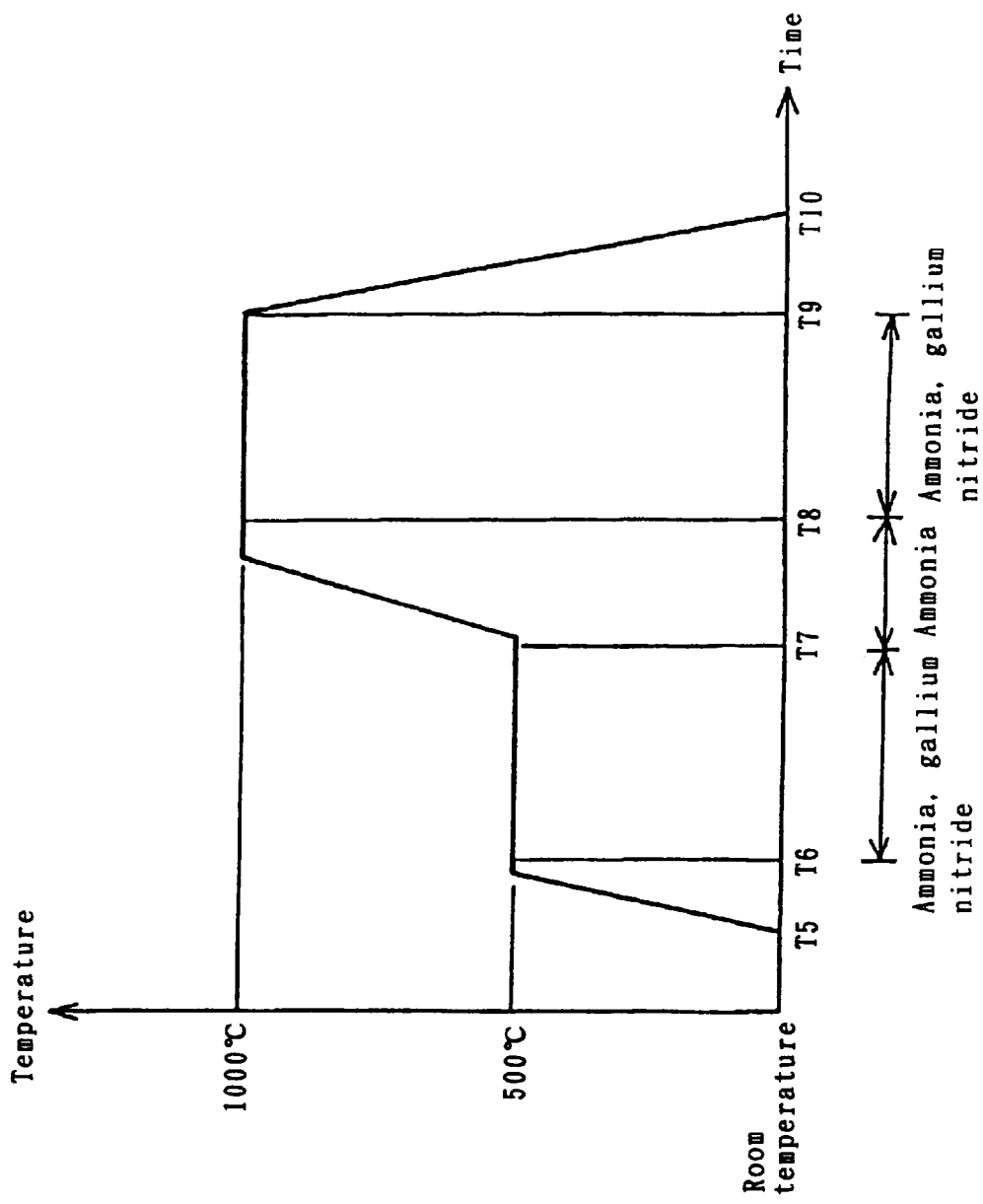
FIG. 4 is a characteristic diagram showing the relation or time, temperature and reaction gas in the same manufacturing process.

First, by sputtering a zinc oxide target in an oxygen atmosphere at 0.01 Torr, a zinc oxide layer 2 of about 500 Angstroms in film thickness is formed on a monocrystalline substrate 1 made of sapphire as shown in FIG. 3(a) and FIG. 3(b).

Next, in a halide VPE apparatus, while holding the monocrystalline substrate temperature at 500° C., from time T6 to time T7, a first gallium nitride crystal 4 of about 500 Angstroms in film thickness is formed on the zinc oxide layer 2, as shown in FIG. 3(c), by the reaction gas consisting of ammonia and gallium chloride formed by reaction of metal gallium and hydrochloric acid gas.

In succession, the first gallium nitride crystal 4 is heated in an ammonia atmosphere from time T7 to time T8. By this heating process, the first gallium nitride crystal 4 is made slightly monocrystalline. Since this heating process is done in an ammonia atmosphere, vaporization of nitrogen from the first gallium nitride layer 4 can be prevented.

Moreover, keeping the substrate temperature at 1000° C., from time T8 to time T9, by feeding ammonia and gallium chloride into the halide VPE apparatus, a second gallium nitride crystal 5 is formed in a film thickness of about 100 $\mu$m as shown in FIG. 3(d).

In this embodiment, same as in the first embodiment, the uniform monocrystalline second gallium nitride crystal 5 can be obtained on the entire surface.

In this embodiment, too, since the second gallium nitride crystal 5 is formed on the first gallium nitride crystal 4 without exposing the first gallium nitride crystal 4 to the atmosphere, surface contamination of the first gallium nitride crystal 4 can be prevented.

(Embodiment 3)

Figure 1:
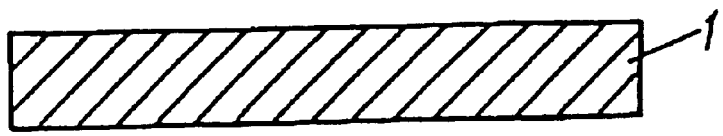
FIG. 1(a), FIG. 1(b), FIG. 1(c), and FIG. 1(d) are sectional views showing the manufacturing process of a semiconductor device in a first embodiment of the invention.
Figure 1:
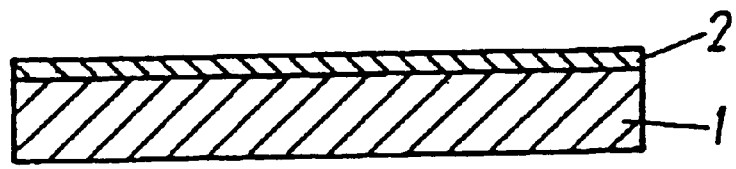
Figure 1:
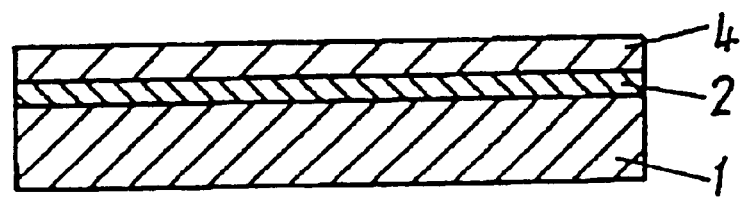
Figure 1:
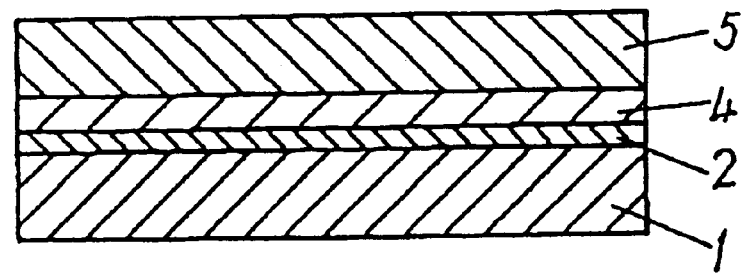
Figure 2:
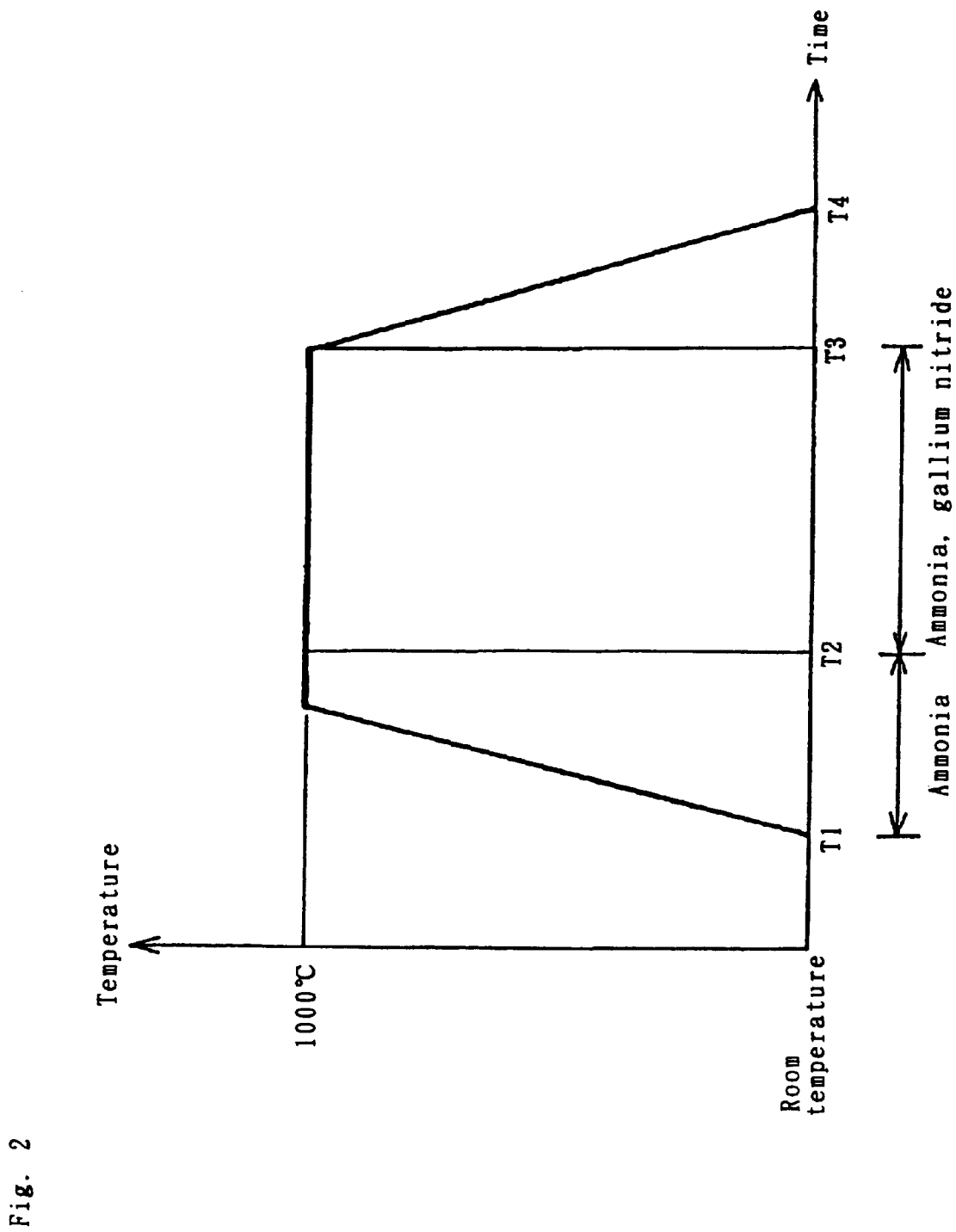
FIG. 2 is a characteristic diagram showing the relation of time, temperature and reaction gas in the same manufacturing process.

FIG. 5(a) through FIG. 5(e) are process sectional views showing a manufacturing method of semiconductor device according to a third embodiment of the invention, and the process shown from FIG. 5(a) to FIG. 5(d) is same as the process shown in FIG. 1 (a) to FIG. 1(d), or FIG. 3(a) to FIG. 3(d), in which the monocrystalline second gallium nitride crystal 5 is manufactured.

Figure 5:
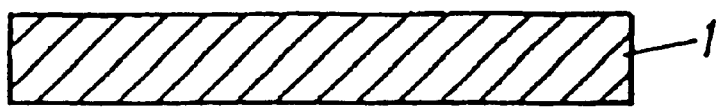
Figure 5:
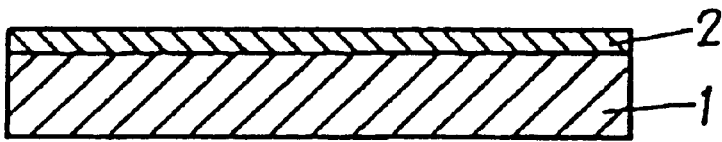
Figure 5:
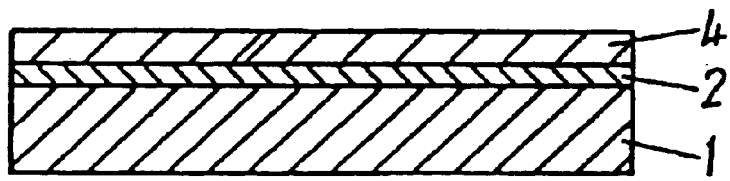
Figure 5:
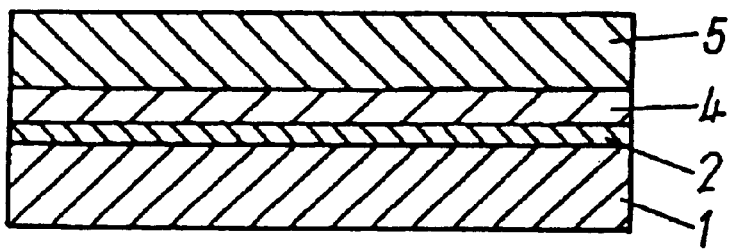
Figure 5:
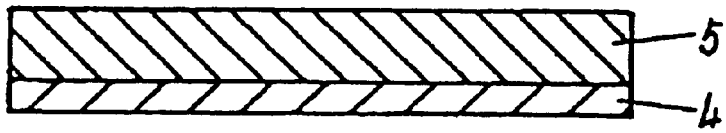
Figure 6:
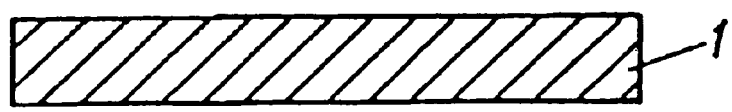
FIG. 6 is a sectional view showing a conventional manufacturing process of semiconductor device.
Figure 6:
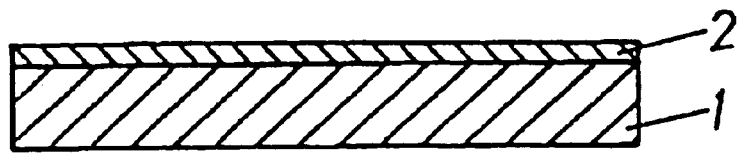
Figure 6:
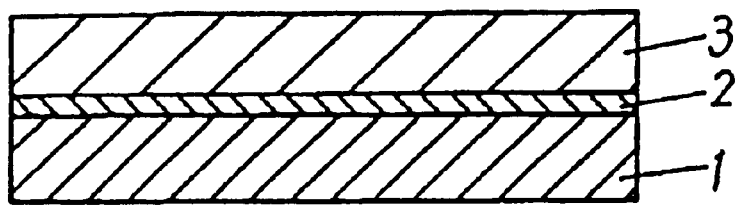

After forming the second gallium nitride crystal 5 in the process shown in FIG. 5(d), the monocrystalline substrate 1 on which the zinc oxide layer 2, first gallium nitride crystal 4 and second gallium nitride crystal 5 are sequentially formed is immersed in aqua regia (nitric acid: hydrochloric acid=1:3), and the zinc oxide layer 2 is removed by etching as shown in FIG. 5(e), so that the monocrystalline substrate 1 is peeled and removed. As a result, the first gallium nitride crystal 4 and second gallium nitride crystal 5 are obtained as a single gallium nitride substrate. Thus obtained gallium nitride substrate has an n-type conductivity.

On this n-type gallium nitride substrate, n-type gallium nitride and p-type gallium nitride are formed sequentially by, for example, organic metal vapor phase growth method, and electrodes are formed on both sides of the n-type gallium nitride substrate and p-type gallium nitride substrate, so that a pn-junction diode can be fabricated in a very simple process. Moreover, since this organic metal vapor phases growth method is a crystal growth method free from lattice mismatching, the obtained gallium nitride is excellent in crystallinity, and in this embodiment, therefore, excellent electrical characteristics such as high light emission efficiency and high humidity resistance in reverse direction are obtained.

In the embodiments of the invention, from a practical point, of view, the forming temperature of the first gallium nitride crystal 4 and second gallium nitride crystal 5 should be preferably 0° C. or more and 2000° C. or less respectively.

As described herein, according to the manufacturing method of semiconductor device of the invention, gallium nitride crystals of a uniform single crystal can be obtained.

What is claimed is:

1. A manufacturing method of semiconductor device comprising the steps of forming a zinc oxide layer on a monocrystalline substrate, forming a first gallium nitride crystal film on said zinc oxide layer in a temperature range from 0° C. to 900° C., and forming a second gallium nitride crystal film on said first gallium nitride crystal in a temperature range from 900° C. to 2000° C.

2. A manufacturing method of semiconductor device of claim 1 wherein after forming the second gallium nitride crystal film, the zinc oxide layer and first gallium nitride crystal film are separated.

3. A manufacturing method of semiconductor device of claim 1 or 2, further comprising a step of heating the monocrystalline substrate in an atmosphere of nitrogen compound, after forming the first gallium nitride crystal film and before forming the second gallium nitride crystal film.

4. A manufacturing method of semiconductor device of claim 1 or 2, wherein the zinc oxide layer and first gallium nitride crystal film are formed continuously without being exposed to the atmosphere.

5. A manufacturing method of semiconductor device of claim 1 or 2, wherein the zinc oxide layer, first, gallium nitride crystal film, and second gallium nitride crystal film are formed continuously without being exposed to the atmosphere.

* * * * *